United States Patent
Graham

(10) Patent No.: US 11,486,661 B2
(45) Date of Patent: Nov. 1, 2022

(54) THERMAL BRIDGE FOR AN ELECTRICAL COMPONENT

(71) Applicant: TE Connectivity Services GmbH, Schaffhausen (CH)

(72) Inventor: Leo Joseph Graham, Hershey, PA (US)

(73) Assignee: TE CONNECTIVITY SOLUTIONS GmbH, Schaffhausen (CH)

(*) Notice: Subject to any disclaimer, the term of this patent is extended or adjusted under 35 U.S.C. 154(b) by 334 days.

(21) Appl. No.: 16/886,263

(22) Filed: May 28, 2020

(65) Prior Publication Data
US 2021/0372713 A1 Dec. 2, 2021

(51) Int. Cl.
*F28F 9/26* (2006.01)
*F28F 9/00* (2006.01)
*H05K 7/20* (2006.01)

(52) U.S. Cl.
CPC .............. *F28F 9/262* (2013.01); *F28F 9/001* (2013.01); *H05K 7/2039* (2013.01)

(58) Field of Classification Search
CPC ........ F28F 9/262; F28F 9/001; H05K 7/2039; H05K 7/20454
USPC ..................................................... 361/704
See application file for complete search history.

(56) References Cited

U.S. PATENT DOCUMENTS

| | | | | | |
|---|---|---|---|---|---|
| 4,442,450 A | * | 4/1984 | Lipschutz | ............. | H01L 23/433 257/E23.09 |
| 4,498,530 A | * | 2/1985 | Lipschutz | ........... | H01L 23/4338 361/717 |
| 4,535,841 A | * | 8/1985 | Kok | ..................... | H01L 23/4338 228/183 |
| 5,052,481 A | * | 10/1991 | Horvath | .............. | H01L 23/4338 165/185 |
| 6,910,271 B2 | * | 6/2005 | Peterson | .................. | F28F 23/00 165/185 |
| 9,668,380 B2 | * | 5/2017 | Bucher | ................... | H05K 7/205 |
| 11,240,934 B1 | * | 2/2022 | Bucher | ................ | H05K 7/2049 |
| 11,291,140 B2 | * | 3/2022 | Bucher | .................... | H01L 23/40 |
| 2020/0373706 A1 | * | 11/2020 | Bucher | ............. | H01R 13/6594 |

* cited by examiner

*Primary Examiner* — Jon T. Schermerhorn, Jr.

(57) ABSTRACT

A thermal bridge includes an upper bridge assembly including upper plates arranged in an upper plate stack and a lower bridge assembly including lower plates arranged in a lower plate stack. The thermal bridge includes upper spring elements extending from upper plates having upper mating interfaces engaging lower plates to bias the upper plates in a first biasing direction generally away from the lower bridge assembly. The thermal bridge includes lower spring elements extending from lower plates having lower mating interfaces engaging upper plates to bias the lower plates in a second biasing direction generally away from the upper bridge assembly. A bridge frame having connecting elements extends through the upper plates and the lower plates to hold the upper plates in the upper plate stack and to hold the lower plates in the lower plate stack.

20 Claims, 7 Drawing Sheets

THERMAL BRIDGE FOR AN ELECTRICAL COMPONENT

BACKGROUND OF THE INVENTION

The subject matter herein relates generally to heat dissipation for electrical components.

It may be desirable to transfer thermal energy (or heat) away from designated components of a system or device. Some systems use electrical components, such as electrical connectors, to transmit data and/or electrical power to and from different systems or devices. Some systems use electrical components, such as pluggable modules for transmitting data signals through communication cable(s) in the form of optical signals and/or electrical signals. Some systems use electrical components, such as integrated circuits, for controlling the system. The electrical components define heat generating sources within the system.

A common challenge that confronts developers of electrical systems is heat management. Thermal energy generated by electrical components within a system can degrade performance or even damage components of the system. To dissipate the thermal energy, systems include a thermal component, such as a heat sink, which engages the heat source, absorbs the thermal energy from the heat source, and transfers the thermal energy away. The heat sink is typically thermally coupled to another thermal component at yet another thermal interface. The components lose efficiency at each thermal interface. Additionally, it is difficult to achieve efficient thermal coupling at the interfaces due to limited thermal interface areas and variations in the surfaces, such as due to surface flatness of the interfacing surfaces.

Accordingly, there is a need for a thermal transfer assembly that efficiently transfers thermal energy away from an electrical component.

BRIEF DESCRIPTION OF THE INVENTION

In one embodiment, a thermal bridge is provided. The thermal bridge includes an upper bridge assembly including a plurality of upper plates arranged in an upper plate stack. Each upper plate has a front end and a rear end. Each upper plate has sides between the front end and the rear end. Each upper plate has an inner end and an outer end. The thermal bridge includes a lower bridge assembly including a plurality of lower plates arranged in a lower plate stack. Each lower plate has a front end and a rear end. Each lower plate has sides between the front end and the rear end. Each lower plate has an inner end and an outer end. The outer ends of the lower plates are configured to face and thermally couple to an electrical component. The sides of the lower plates face the sides of the upper plates to thermally interface the lower plates with the upper plates. The thermal bridge includes upper spring elements extending from the inner ends of corresponding upper plates. Each upper spring element includes an upper mating interface engaging the lower bridge assembly to bias the upper plates in a first biasing direction generally away from the lower bridge assembly. The thermal bridge includes lower spring elements extending from the inner ends of corresponding lower plates. Each lower spring element includes a lower mating interface engaging the upper bridge assembly to bias the lower plates in a second biasing direction generally away from the upper bridge assembly.

In another embodiment, a thermal bridge is provided. The thermal bridge includes an upper bridge assembly including a plurality of upper plates arranged in an upper plate stack. Each upper plate has a front end and a rear end. Each upper plate has sides between the front end and the rear end. Each upper plate has an inner end and an outer end. The upper plates include upper bridge plates and upper spacer plates. The upper bridge plates have upper overlapping regions. The thermal bridge includes a lower bridge assembly including a plurality of lower plates arranged in a lower plate stack. Each lower plate has a front end and a rear end. Each lower plate has sides between the front end and the rear end. Each lower plate has an inner end and an outer end. The lower plates include lower bridge plates and lower spacer plates. The lower bridge plates have lower overlapping regions. The lower plates are configured to face and thermally couple to an electrical component. The lower spacer plates are aligned with the upper bridge plates and the lower bridge plates are aligned with the upper spacer plates such that the lower overlapping regions overlap with the upper overlapping regions. The sides of the lower bridge plates thermally interface with the sides of the upper bridge plates. Upper spring elements extend from the inner ends of corresponding upper bridge plates. Each upper spring element includes an upper mating interface engaging the corresponding lower spacer plate to bias the upper plates in a first biasing direction generally away from the lower bridge assembly. Lower spring elements extend from the inner ends of corresponding lower bridge plates. Each lower spring element includes a lower mating interface engaging the corresponding upper spacer plate to bias the lower plates in a second biasing direction generally away from the upper bridge assembly. A bridge frame has connecting elements extending internally through the upper plates and the lower plates to hold the upper plates in the upper plate stack and the lower plates in the lower plate stack.

In a further embodiment, a communication system is provided. The communication system includes an electrical component having a component thermal interface, a heat transfer device having a device thermal interface, and a thermal bridge thermally coupled between the component thermal interface and the device thermal interface. The thermal bridge includes an upper bridge assembly including a plurality of upper plates arranged in an upper plate stack. Each upper plate has a front end and a rear end. Each upper plate has sides between the front end and the rear end. Each upper plate has an inner end and an outer end. The upper plates include upper bridge plates and upper spacer plates. The upper bridge plates have upper overlapping regions. The thermal bridge includes a lower bridge assembly including a plurality of lower plates arranged in a lower plate stack. Each lower plate has a front end and a rear end. Each lower plate has sides between the front end and the rear end. Each lower plate has an inner end and an outer end. The lower plates include lower bridge plates and lower spacer plates. The lower bridge plates have lower overlapping regions. The lower plates are configured to face and thermally couple to an electrical component. The lower spacer plates are aligned with the upper bridge plates and the lower bridge plates being aligned with the upper spacer plates such that the lower overlapping regions overlap with the upper overlapping regions. The sides of the lower bridge plates thermally interface with the sides of the upper bridge plates. Upper spring elements extend from the inner ends of corresponding upper bridge plates. Each upper spring element includes an upper mating interface engaging the corresponding lower spacer plate to bias the upper plates in a first biasing direction generally away from the lower bridge assembly. Lower spring elements extend from the inner ends of corresponding lower bridge plates. Each lower spring element includes a lower mating interface engaging the corresponding upper spacer plate to bias the lower plates in a second biasing direction generally away from the upper bridge assembly. The thermal bridge include an internal bridge frame that has connecting elements extending internally through the upper plates and the lower plates to hold the upper plates in the upper plate stack and the lower plates in the lower plate stack

DETAILED DESCRIPTION OF THE INVENTION

Figure 1:
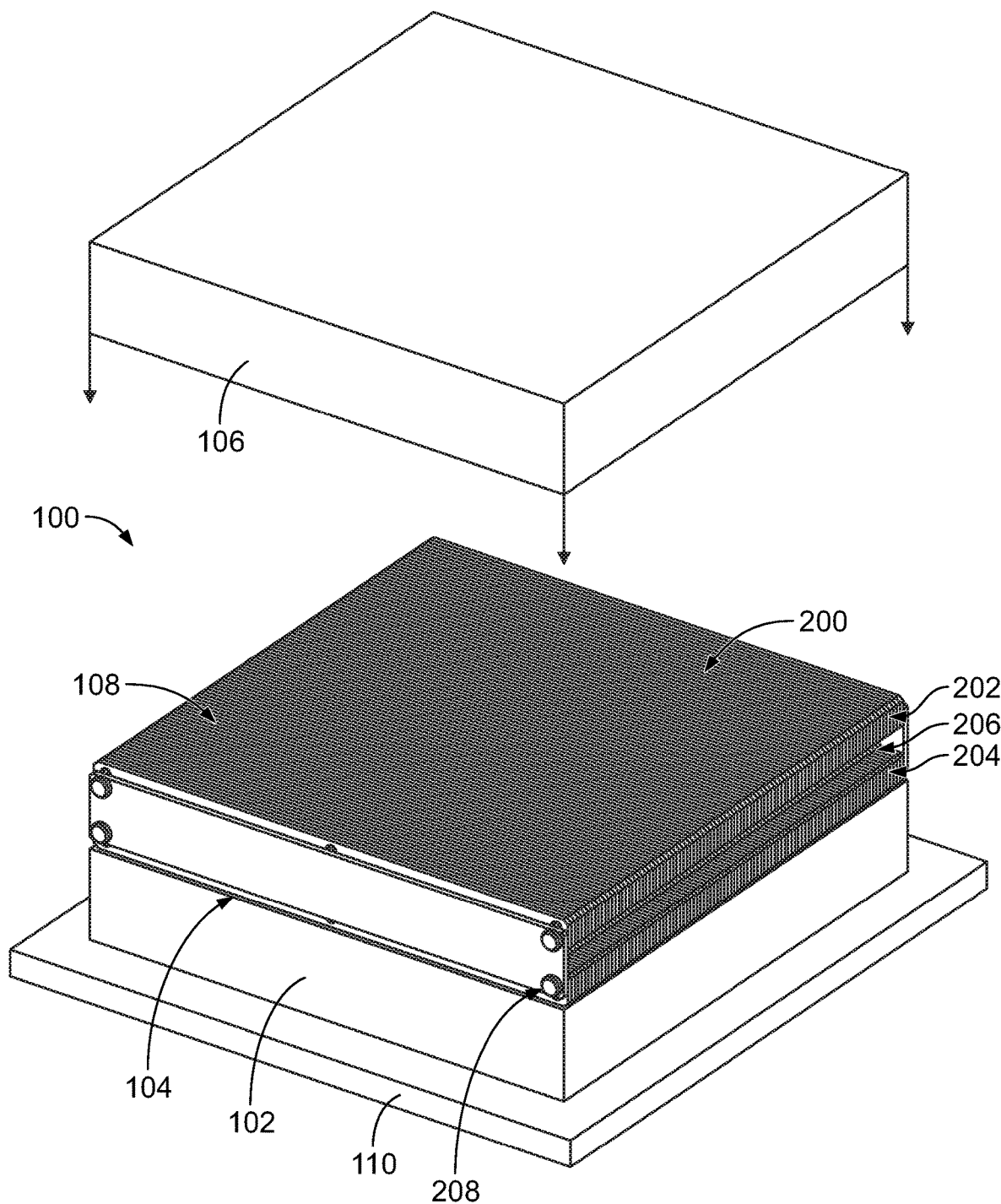
FIG. 1 is a front perspective view of a communication system and a thermal bridge in accordance with an exemplary embodiment.

FIG. 1 is a front perspective view of a communication system 100 and a thermal bridge 200 in accordance with an exemplary embodiment for dissipating heat from at least one electrical component 102 of the communication system 100. The thermal bridge 200 is configured to be thermally coupled to the electrical component 102 at a lower thermal interface 104 at a bottom of the thermal bridge 200. In an exemplary embodiment, a heat transfer device 106 is provided to dissipate heat from the thermal bridge 200. For example, the thermal bridge 200 is configured to be thermally coupled to the heat transfer device 106 at an upper thermal interface 108. The thermal bridge 200 forms a thermal interface between the electrical component 102 and the heat transfer device 106. The heat transfer device 106 may be a heat sink, such as a finned heat sink, configured to be air cooled by transferring heat to the passing airflow. In other various embodiments, the heat transfer device 106 may be a heat spreader, a cold plate having liquid cooling, and the like. In alternative embodiments, the communication system 100 may be provided without a separate heat transfer device, rather relying on the thermal bridge 200 dissipating heat directly into the external environment.

In an exemplary embodiment, the thermal bridge 200 is compressible between the electrical component 102 and the heat transfer device 106. In an exemplary embodiment, the lower thermal interface 104 is conformable to a shape of the electrical component 102 and the upper thermal interface 108 is conformable to a shape of the heat transfer device 106 for efficient thermal transfer therebetween.

In an exemplary embodiment, the electrical component 102 is mounted to a circuit board 110. In various embodiments, the electrical component 102 may be a communication connector, such as a receptacle connector, a header connector, a plug connector, or another type of communication connector. In other various embodiments, the electrical component 102 may be an electronic package, such as an integrated circuit or an ASIC. In other various embodiments, the electrical component 102 may be a pluggable module, such as an I/O transceiver module. Other types of electrical components may be provided in alternative embodiments.

In an exemplary embodiment, the thermal bridge 200 includes an upper bridge assembly 202 and a lower bridge assembly 204 coupled together to form the thermal bridge 200. The lower bridge assembly 204 is configured to thermally engage the electrical component 102. The upper bridge assembly 202 is configured to dissipate heat into the external environment and/or to the heat transfer device 106. The upper bridge assembly 202 is in thermal communication with the lower bridge assembly 204 and dissipates heat away from the lower bridge assembly 204 to cool the electrical component 102. In an exemplary embodiment, the thermal bridge 200 includes a spring assembly 206 (shown in FIG. 2) between the upper and lower bridge assemblies 202, 204 to press the upper and lower bridge assemblies 202, 204 apart, such as into thermal engagement with the electrical component 102 and the heat transfer device 106. In an exemplary embodiment, the thermal bridge 200 includes a bridge frame 208 for holding the upper and lower bridge assemblies 202, 204 together. The bridge frame 208 provides internal support for the upper and lower bridge assemblies 202, 204. The internal support eliminates the need for an external frames, which provides more surface area for heat dissipation and/or for the thermal interface with the heat transfer device 106.

The upper and lower bridge assemblies 202, 204 are compressible relative to each other. For example, the upper and lower bridge assemblies 202, 204 are compressible between the electrical component 102 and the heat transfer device 106. The spring assembly 206 is used to bias the upper and lower bridge assemblies 202, 204 apart. In an exemplary embodiment, the spring assembly 206 presses the upper bridge assembly 202 outward in a first biasing direction (for example, upward) against the bridge frame 208 and the spring assembly 206 presses the lower bridge assembly 204 outward in a second biasing direction (for example, downward) against the bridge frame 208. The upper bridge assembly 202 and the lower bridge assembly 204 may be held by the bridge frame 208 in a manner to allow a limited amount of floating movement of the upper bridge assembly 202 and the lower bridge assembly 204 relative to the bridge frame 208.

Figure 2:
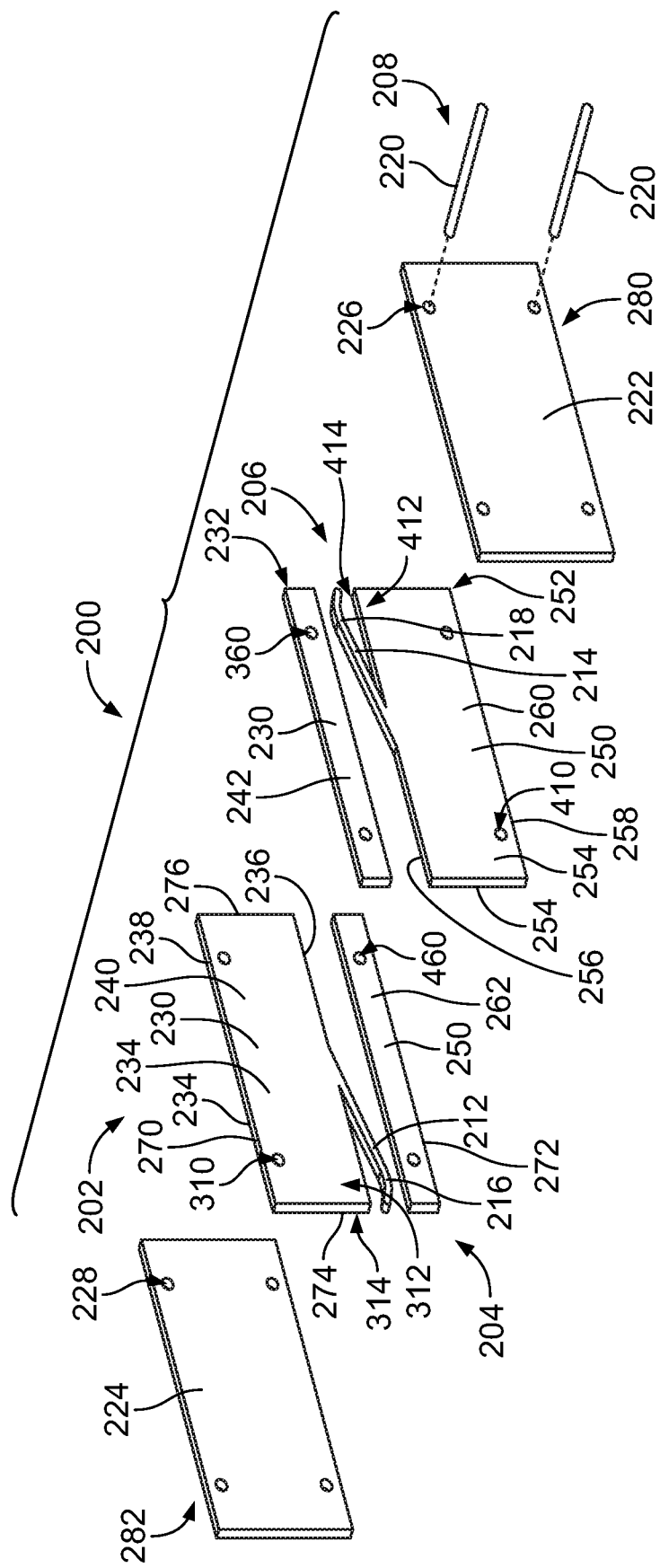
FIG. 2 is an exploded view of the thermal bridge in accordance with an exemplary embodiment.
Figure 3:
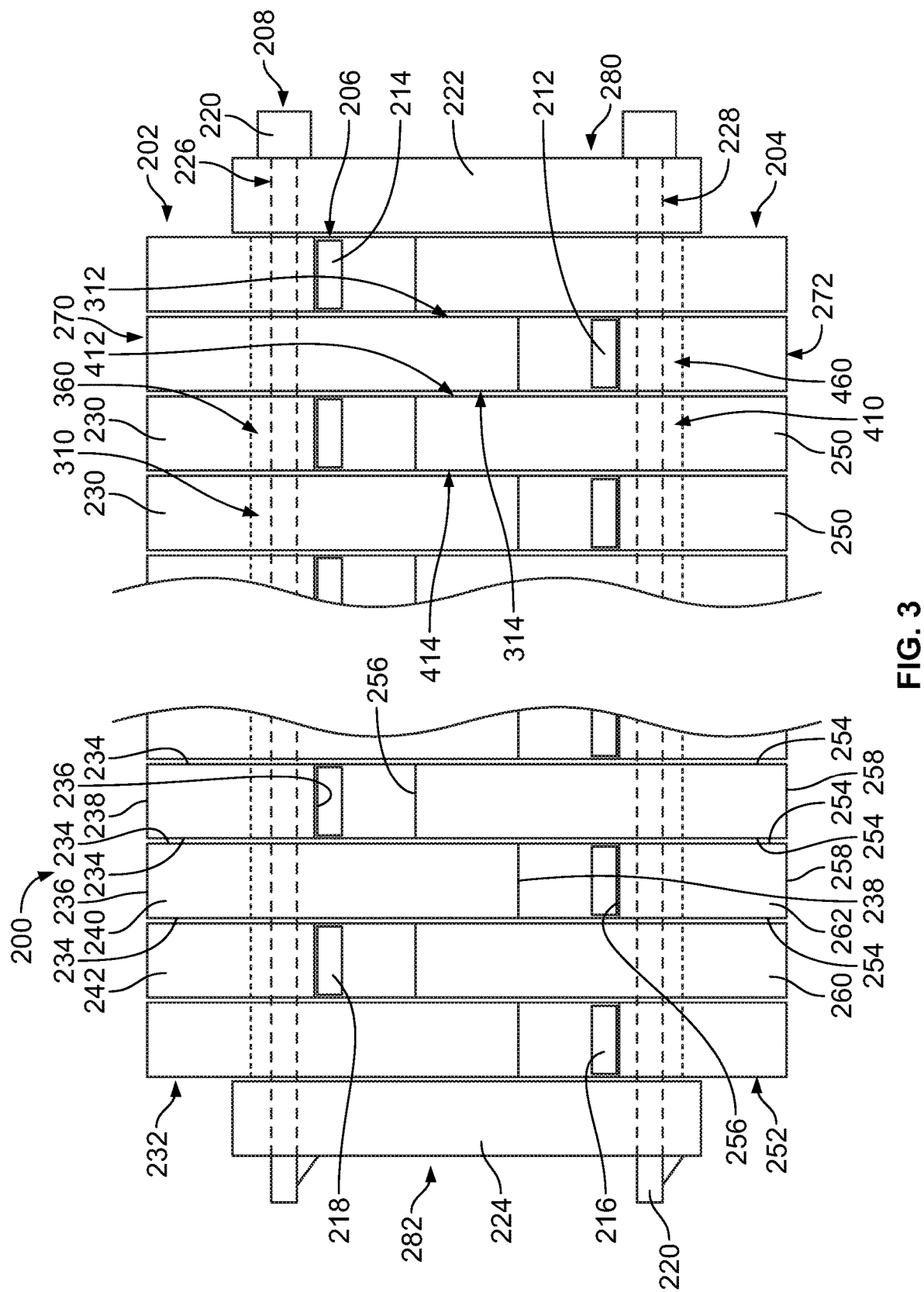
FIG. 3 is a cross-sectional view of the thermal bridge in accordance with an exemplary embodiment.

FIG. 2 is an exploded view of a portion of the thermal bridge 200 in accordance with an exemplary embodiment showing portions of the upper and lower bridge assemblies 202, 204. FIG. 3 is a cross-sectional view of the thermal bridge 200 in accordance with an exemplary embodiment. The thermal bridge 200 includes the upper bridge assembly 202 and the lower bridge assembly 204. The spring assembly 206 is located between the upper and lower bridge assemblies 202, 204. The bridge frame 208 is configured to hold the upper and lower bridge assemblies 202, 204.

In an exemplary embodiment, the thermal bridge 200 is parallelepiped (for example, generally box shaped). For example, the thermal bridge 200 includes a top 270, a bottom 272, a front 274, a rear 276, a first side 280, and a second side 282. The top 270 may be generally planar. The bottom 272 may be generally planar. The front 274 may be generally planar. The rear 276 may be generally planar. The first side 280 may be generally planar. The second side 282 may be generally planar. The thermal bridge 200 may have other shapes in alternative embodiments other than the parallelepiped shape shown in the illustrated embodiment. In various embodiments, the top 270 and/or the bottom 272 may be conformable to the shape of the heat transfer device 106 or the electrical component 102, respectively. For example, the upper bridge assembly 202 may float relative to the lower bridge assembly 204 and the spring assembly 206 may allow the floating movement of the upper and lower bridge assemblies 202, 204. In an exemplary embodiment, the frame structure used to hold the thermal bridge 200 together is defined by the bridge frame 208, which extends through the upper and lower bridge assemblies 204. The bridge frame 208 allows for a large amount of usable external surface area for the thermal bridge 200. Other types of frame assemblies may be used in alternative embodiments, such as an external or perimeter frame structure. In an exemplary embodiment, the bridge frame 208 includes first and second side plates 222, 224 arranged at the first side 280 and the second side 282 to contain and sandwich the upper and lower bridge assemblies 202, 204 therebetween. The bridge frame 208 includes connecting elements 220 extending between the side plates 222, 224 through the upper and lower bridge assemblies 202, 204. The connecting elements 220 hold the first and second side plates 222, 224 with the upper and lower bridge assemblies 202, 204 therebetween.

In an exemplary embodiment, the bridge assemblies 202, 204 each include a plurality of plates that are arranged together in plate stacks. The plates are interleaved with each other for thermal communication between the upper bridge assembly 202 and the lower bridge assembly 204. The individual plates are movable relative to each other such that the plates may be individually articulated to conform to the electrical component 102 and/or the heat transfer device 106. For example, the individual plates may conform to the electrical component 102 at the lower thermal interface 104 for improved contact and/or proximity between the thermal bridge 200 and the electrical component 102 and/or the individual plates may conform to the heat transfer device 106 at the upper thermal interface 108 for improved contact and/or proximity between the thermal bridge 200 and the heat transfer device 106. Gaps or spaces may be provided between the plates of the bridge assemblies 202, 204 to allow compressive movement of the bridge assemblies 202, 204. The spring assembly 206 spans across the gaps between the bridge assemblies 202, 204.

In an exemplary embodiment, the upper bridge assembly 202 includes a plurality of upper plates 230 arranged in an upper plate stack 232 (only two upper plates 230 are shown in FIG. 2; however, any number of upper plates 230 may be used depending on the width of the upper bridge assembly 202). Each upper plate 230 has sides 234 extending between an inner end 236 and an outer end 238 of the upper plate 230. The inner end 236 faces the lower bridge assembly 204. The outer end 238 faces outward, such as toward the heat transfer device 106. Optionally, various upper plates 230 may have different shapes, such as different heights and/or different features between the inner end 236 and the outer end 238.

In an exemplary embodiment, the upper plates 230 include upper bridge plates 240 and upper spacer plates 242. The upper spacer plates 242 are located between the upper bridge plates 240. Each upper bridge plate 240 includes overlapping regions 312, 314 at the inner end 236 configured to overlap with adjacent lower plates of the lower bridge assembly 204. In the illustrated embodiment, the upper bridge plate 240 is generally rectangular in shape; however, the upper bridge plate 240 may have other shapes in alternative embodiments. In an exemplary embodiment, the upper bridge plates 240 include slots 310 that receive the bridge frame 208. In an exemplary embodiment, the slots 310 are elongated, such as in a vertical direction to allow vertical movement of the upper bridge plates 240 relative to the bridge frame 208.

Each upper spacer plate 242 extends between the inner end 236 and the outer end 238. In the illustrated embodiment, the upper spacer plate 242 is generally rectangular shaped; however, the upper spacer plate 242 may have other shapes in alternative embodiments. In various embodiments, the lower spacer plate is shorter than the lower bridge plate 260. In an exemplary embodiment, the upper spacer plate 242 is configured to be aligned with a corresponding lower plate of the lower bridge assembly 204. A bottom edge of the upper spacer plate 242 may engage the spring assembly 206 when assembled. In an exemplary embodiment, the upper spacer plates 242 include slots 360 that receive the bridge frame 208. In an exemplary embodiment, the slots 360 are elongated, such as in a vertical direction to allow vertical movement of the upper spacer plates 242 relative to the bridge frame 208.

In an exemplary embodiment, the lower bridge assembly 204 includes a plurality of lower plates 250 arranged in a lower plate stack 252 (only two lower plates 250 are shown in FIG. 2; however, any number of lower plates 250 may be used depending on the width of the lower bridge assembly 204). Each lower plate 250 has sides 254 extending between an inner end 256 and an outer end 258 of the lower plate 250. The inner end 256 faces the upper bridge assembly 202. The outer end 258 faces outward, such as toward the electrical component 102 (shown in FIG. 1). Optionally, various lower plates 250 may have different shapes and/or heights between the inner end 256 and the outer end 258.

In an exemplary embodiment, the lower plates 250 include lower bridge plates 260 and lower spacer plates 262. The lower spacer plates 262 are located between the lower bridge plates 260. In the illustrated embodiment, the lower bridge plate 260 is rectangular shaped; however, the lower bridge plate 260 may have other shapes in alternative embodiments. Each lower bridge plate 260 includes overlapping regions 412, 414 at the inner end 256 configured to overlap with adjacent upper plates 230 of the upper bridge assembly 202. For example, the overlapping regions 412, 414 overlap with the overlapping regions 312, 314 of the upper bridge plates 240. The overlapping regions 412, 414 provide large surface areas configured to be thermally coupled to the upper bridge plates 240. The overlapping regions 412, 414 are configured to overlap the overlapping regions 312, 314 by an overlap distance sufficient to allow efficient thermal transfer between the lower plates 250 and the upper plates 230. The sides of the plates are slidable relative to each other to allow movement between the upper plates 230 and the lower plates 250 and change the overlap distance. In an exemplary embodiment, the lower bridge plates 260 include slots 410 that receive the bridge frame 208. In an exemplary embodiment, the slots 410 are elongated, such as in a vertical direction to allow vertical movement of the lower bridge plates 260 relative to the bridge frame 208.

Each lower spacer plate 262 extends between the inner end 256 and the outer end 258. In the illustrated embodiment, the lower spacer plate 262 is rectangular shaped; however, the lower spacer plate 262 may have other shapes in alternative embodiments. In various embodiments, the lower spacer plate is shorter than the lower bridge plate 260. In an exemplary embodiment, the lower spacer plate 262 is configured to be aligned with the corresponding upper bridge plate 240. A top edge of the lower spacer plate 262 may engage the spring assembly 206 when assembled. In an exemplary embodiment, the lower spacer plates 262 include slots 460 that receive the bridge frame 208. In an exemplary embodiment, the slots 460 are elongated, such as in a vertical direction to allow vertical movement of the lower spacer plates 262 relative to the bridge frame 208.

In an exemplary embodiment, the spring assembly 206 is positioned between the upper and lower bridge assemblies 202, 204. For example, the spring assembly 206 includes upper spring elements 212 and lower spring elements 214. In the illustrated embodiment, the upper spring elements 212 include spring arms 216 and the lower spring elements 214 includes spring arms 218. In an exemplary embodiment, the upper spring elements 212 are coplanar with the corresponding upper plates 230 and the lower spring elements 214 are coplanar with the corresponding lower plates 250. For example, the upper spring elements 212 have an upper spring width between the sides of the upper spring elements 212 contained within the width of the upper plate 230 between the sides 234 and the lower spring elements 214 have a lower spring width between sides of the lower spring element 214 contained within the width of the lower plate 250 between the sides 254.

In an exemplary embodiment, the spring assembly 206 is integrated with the upper and lower plates 230, 250. For example, the upper spring elements 212 extend from the upper bridge plates 240 and/or the upper spacer plates 242 and the lower spring elements 214 extend from the lower bridge plates 260 and/or lower spacer plates 262. The upper spring elements 212 may be stamped and formed with the corresponding upper plates 230 and the lower spring elements 214 may be stamped and formed with the corresponding lower plates 250. In alternative embodiments, the spring elements 212, 214 may be separate and discrete from the upper and lower plates 230, 250, respectively. The spring elements 212, 214 may be coupled to the upper and lower plates 230, 250. In various embodiments, the spring elements 212, 214 may be manufactured from a different material than the upper and lower plates 230, 250. The spring elements 212, 214 are flexible and may be compressed when deflected creating an internal spring biasing force that presses against the opposing plate 250, 230, respectively.

The connecting elements 220 of the bridge frame 208 extend internally through the upper bridge assembly 202 and the lower bridge assembly 204. The connecting elements 220 are configured to be coupled to the upper plates 230 and the lower plates 250 to secure the upper plates 230 in the upper plate stack 232 and the lower plates 250 and the lower plate stack 252. In an exemplary embodiment, the connecting elements 220 include one or more upper connecting elements and one or more lower connecting elements. The upper connecting elements 220 are received in the upper slots 310, 360 of the upper bridge plates 240 and the upper spacer plates 242, respectively. The lower connecting elements 220 are received in the lower slots 410, 460 of the lower bridge plates 260 and the lower spacer plates 262. The connecting elements 220 extend between the first side plate 222 and the second side plate 224. For example, the connecting elements 220 may pass through openings 226, 228 in the side plates 222, 224, respectively. In various embodiments, the connecting elements 220 may be formed integral with the first side plate 222 and/or the second side plate 224. For example, the side plates 222, 224 and the connecting elements 220 may be stamped and formed from a sheet of metal. In alternative embodiments, the connecting elements 220 may be separate from the side plates 222, 224 and secured thereto, such as by soldering, crimping, latching, riveting, clipping, using fasteners or otherwise securing the connecting elements 220 to the side plates 222, 224. In other alternative embodiments, the connecting elements 220 may be secured to the thermal bridge 200 without the use of the side plates 222, 224. For example, the connecting elements 220 may be secured directly to plates of the upper bridge assembly 202 and/or the lower bridge assembly 204.

In an exemplary embodiment, the connecting elements 220 are pins or posts. For example, the connecting elements 220 may include a head and a cylindrical shaft extending from the head to a tip. The connecting elements 220 may have other shapes in alternative embodiments. For example, the connecting elements 220 may be flat, planar spars configured to pass through the upper and lower plates 230, 250. For example, the connecting elements 220 may be stamped and formed from a metal sheet.

Figure 4:
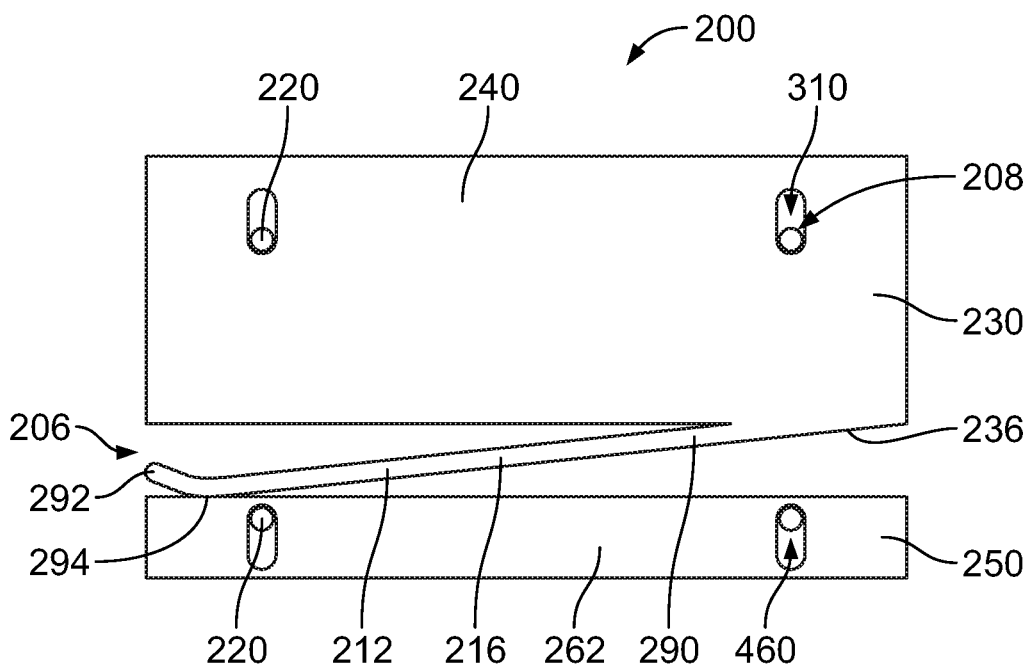
FIG. 4 is a cross-sectional view of the thermal bridge in accordance with an exemplary embodiment showing the thermal bridge in an expanded state.
Figure 5:
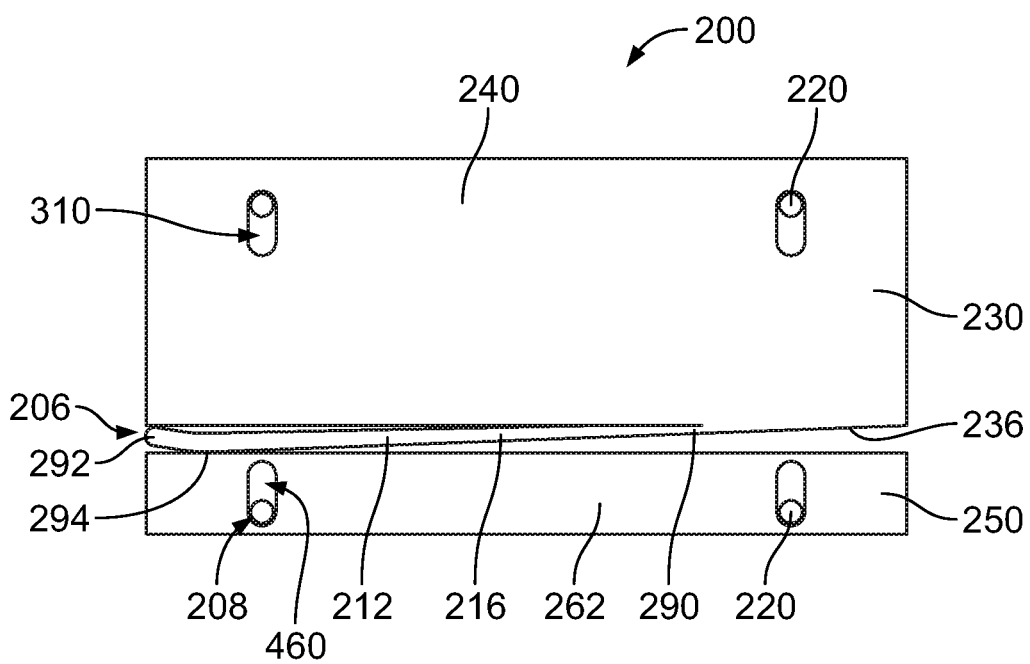
FIG. 5 is a cross-sectional view of the thermal bridge in accordance with an exemplary embodiment showing the thermal bridge in a compressed state.

FIG. 4 is a cross-sectional view of the thermal bridge 200 taken through one of the upper bridge plates 240 and one of the lower spacer plates 262 in accordance with an exemplary embodiment showing the thermal bridge 200 in an expanded state. FIG. 5 is a cross-sectional view of the thermal bridge 200 taken through one of the upper bridge plate 240 and the lower spacer plates 262 in accordance with an exemplary embodiment showing the thermal bridge 200 in a compressed state.

When assembled, the lower spacer plate 262 is aligned with the upper bridge plate 240. The spring assembly 206 is located between the upper bridge plate 240 and the lower spacer plate 262. In the illustrated embodiment, the spring assembly 206 includes the upper spring element 212 between the upper plate 230 and the lower plate 250. The upper spring element 212 presses the upper plate 230 in an upward biasing direction and/or presses the lower plate 250 in a downward biasing direction. The upper spring element 212 tends to separate the upper plate 230 from the lower plate 250 to press the upper bridge plate 240 into thermal engagement with the heat transfer device 106 and to press the lower spacer plates 262 into thermal engagement with the electrical component 102. The upper bridge plate 240 and the lower spacer plate 262 are independently movable relative to each other and relative to adjacent upper plates 230 and lower plates 250.

The upper spring element 212 includes the spring arm 216. In an exemplary embodiment, the spring arm 216 is integrated with the upper plate 230. For example, the spring arm 216 may be stamped and formed with the upper plate 230. The spring arm 216 is compressible between the upper and lower plates 230, 250. In an exemplary embodiment, the spring arm 216 extends between a proximal end 290 and a distal end 292. The spring arm 216 extends at a transverse angle relative to the biasing direction. The spring arm 216 may be angled transverse relative to the inner end 236. The spring arm 216 includes an upper mating interface 294 at or near the distal end 292. The upper mating interface 294 is configured to engage the lower plate 250 to bias the upper plates 230 in the first biasing direction generally away from the lower plate 250. In alternative embodiments, the upper mating interface 294 may be remote from the distal end 292, such as approximately centered between the proximal end 290 and the distal end 292. In such embodiments, the distal end 292 may engage the inner end 236 of the upper plate 230 such that the spring arm 216 is supported at both ends by the upper plate 230.

The bridge frame 208 passes through the upper bridge plate 240 and the lower spacer plate 262. For example, the connecting elements 220 pass through the slots 310 and the slots 460. In the expanded state, the connecting elements 220 are located at or near the inner edges of the slots 310, 460. In the compressed state, the connecting elements 220 are located at or near the outer edges of the slots 310, 460.

Figure 6:
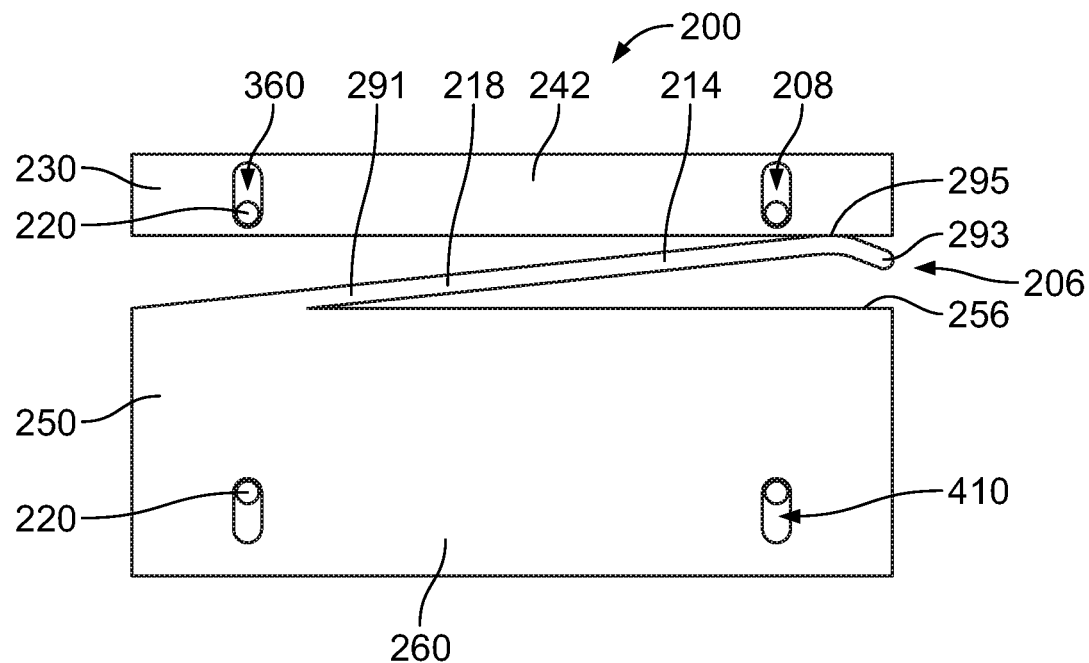
FIG. 6 is a cross-sectional view of the thermal bridge in accordance with an exemplary embodiment showing the thermal bridge in an expanded state.
Figure 7:
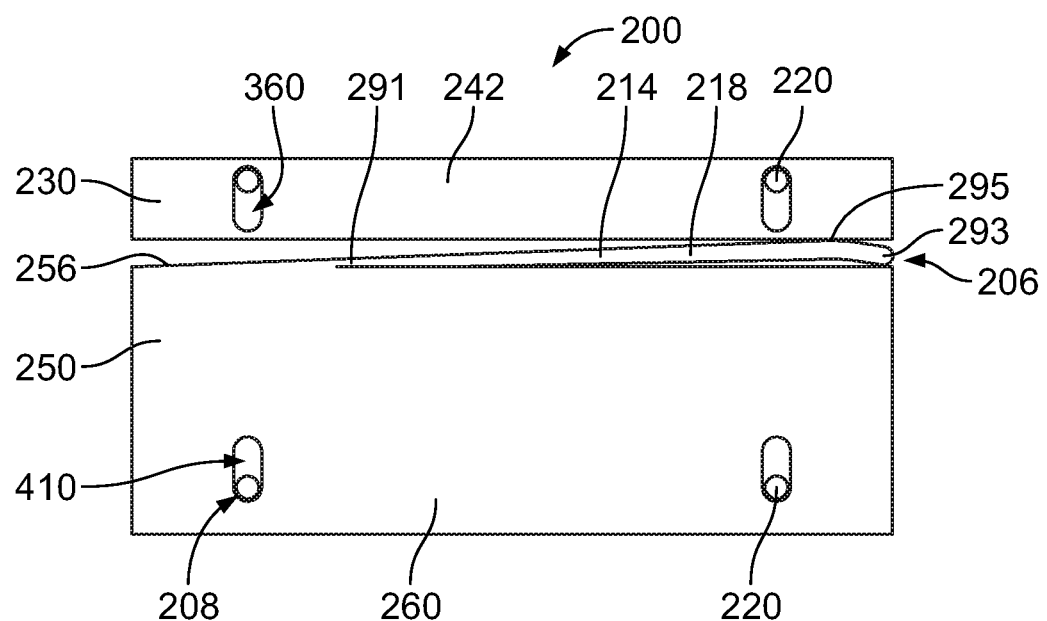
FIG. 7 is a cross-sectional view of the thermal bridge in accordance with an exemplary embodiment showing the thermal bridge in a compressed state.

FIG. 6 is a cross-sectional view of the thermal bridge 200 taken through one of the upper spacer plates 242 and one of the lower bridge plates 260 in accordance with an exemplary embodiment showing the thermal bridge 200 in an expanded state. FIG. 7 is a cross-sectional view of the thermal bridge 200 taken through the upper spacer plate 242 and the lower bridge plate 260 in accordance with an exemplary embodiment showing the thermal bridge 200 in a compressed state.

When assembled, the upper spacer plate 242 is aligned with the lower bridge plate 260. The spring assembly 206 is located between the upper plate 230 and the lower plate 250. In the illustrated embodiment, the spring assembly 206 includes the lower spring element 214 between the upper plate 230 and the lower plate 250. The lower spring element 214 presses the upper plate 230 in an upward biasing direction and presses the lower plate 250 in a downward biasing direction. The lower spring element 214 tends to separate the upper plate 230 from the lower plate 250 to press the upper spacer plate 242 into thermal engagement with the heat transfer device 106 and to press the lower bridge plate 260 into thermal engagement with the electrical component 102. The upper spacer plate 242 and the lower bridge plate 260 are independently movable relative to each other and relative to adjacent upper plates 230 and lower plates 250.

The lower spring element 214 includes the spring arm 218. In an exemplary embodiment, the spring arm 218 is integrated with the lower plate 250. For example, the spring arm 218 may be stamped and formed with the lower plate 250. The spring arm 218 is compressible between the upper and lower plates 230, 250. In an exemplary embodiment, the spring arm 218 extends between a proximal end 291 and a distal end 293. The spring arm 218 extends at a transverse angle relative to the biasing direction. The spring arm 218 may be angled transverse relative to the inner end 256. The spring arm 218 includes a lower mating interface 295 at or near the distal end 293. The lower mating interface 295 is configured to engage the upper plate 230 to bias the lower plates 250 in the second biasing direction generally away from the upper plate 230. In alternative embodiments, the lower mating interface 295 may be remote from the distal end 293, such as approximately centered between the proximal end 291 and the distal end 293. In such embodiments, the distal end 293 may engage the inner end 256 of the lower plate 250 such that the spring arm 218 is supported at both ends by the lower plate 250.

The bridge frame 208 passes through the upper spacer plate 242 and the lower bridge plate 260. For example, the connecting elements 220 pass through the slots 360 and the slots 410. In the expanded state, the connecting elements 220 are located at or near the inner edges of the slots 360, 410. In the compressed state, the connecting elements 220 are located at or near the outer edges of the slots 360, 410.

Figure 8:
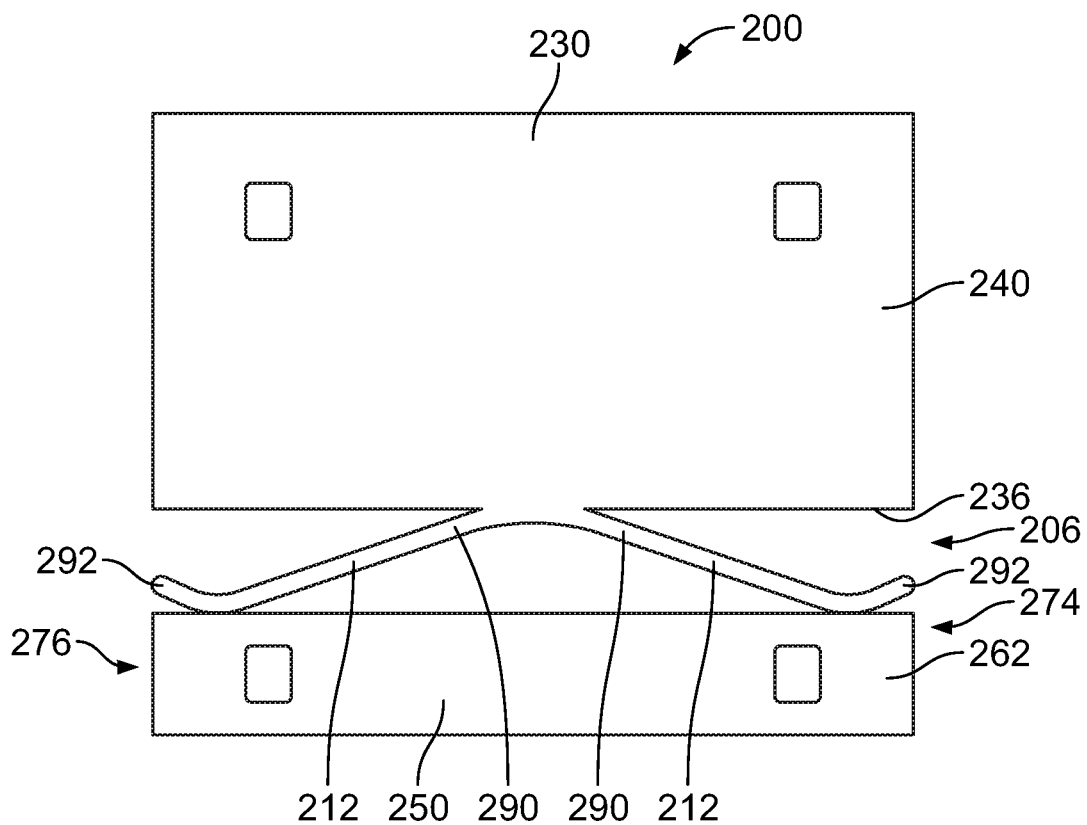
FIG. 8 is a cross-sectional view of the thermal bridge in accordance with an exemplary embodiment.
Figure 9:
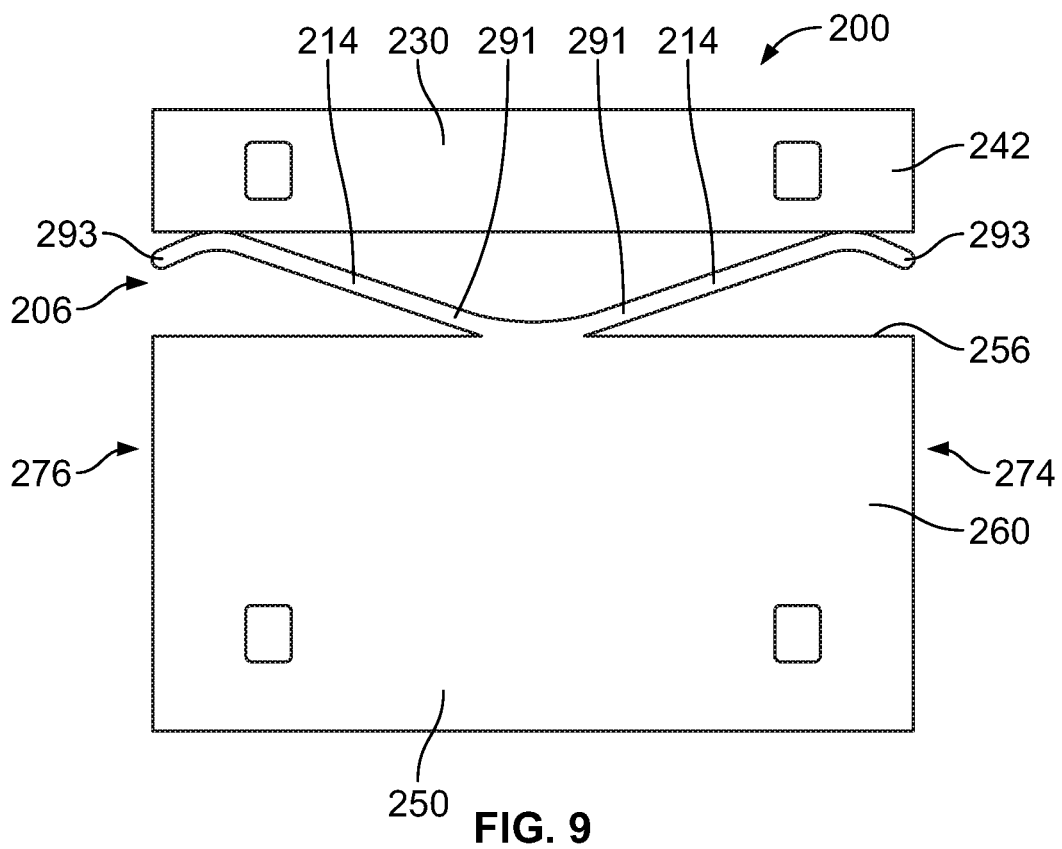
FIG. 9 is a cross-sectional view of the thermal bridge in accordance with an exemplary embodiment.

FIG. 8 is a cross-sectional view of the thermal bridge 200 in accordance with an exemplary embodiment taken through one of the upper bridge plates 240 and one of the lower spacer plates 262. FIG. 9 is a cross-sectional view of the thermal bridge 200 in accordance with an exemplary embodiment taken through one of the upper spacer plates 242 and one of the lower bridge plates 260.

The spring assembly 206 is located between the upper plates 230 and the lower plates 250. In the illustrated embodiment, the spring assembly 206 includes a pair of the upper spring elements 212 and a pair of the lower spring elements 214. The upper spring elements 212 are integrated with the upper plate 230, such as being stamped and formed with the upper plate 230. The proximal ends 290 of the upper spring elements 212 are approximately centered along the inner end 236 and the distal ends 292 of the upper spring elements 212 are located near the front 274 and the rear 276 of the thermal bridge 200. Other orientations are possible in alternative embodiments. The lower spring elements 214 are integrated with the lower plate 250, such as being stamped and formed with the lower plate 250. The proximal ends 291 of the lower spring elements 214 are approximately centered along the inner end 256 and the distal ends 293 of the lower spring elements 214 are located near the front 274 and the rear 276 of the thermal bridge 200. Other orientations are possible in alternative embodiments.

Figure 10:
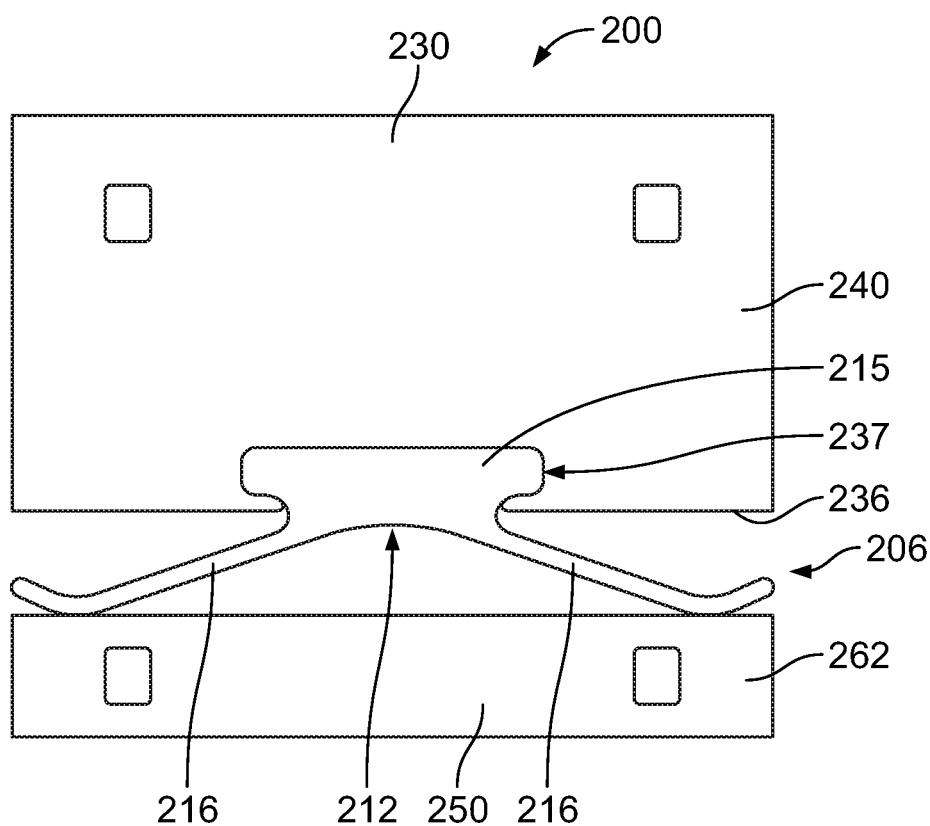
FIG. 10 is a cross-sectional view of the thermal bridge in accordance with an exemplary embodiment.
Figure 11:
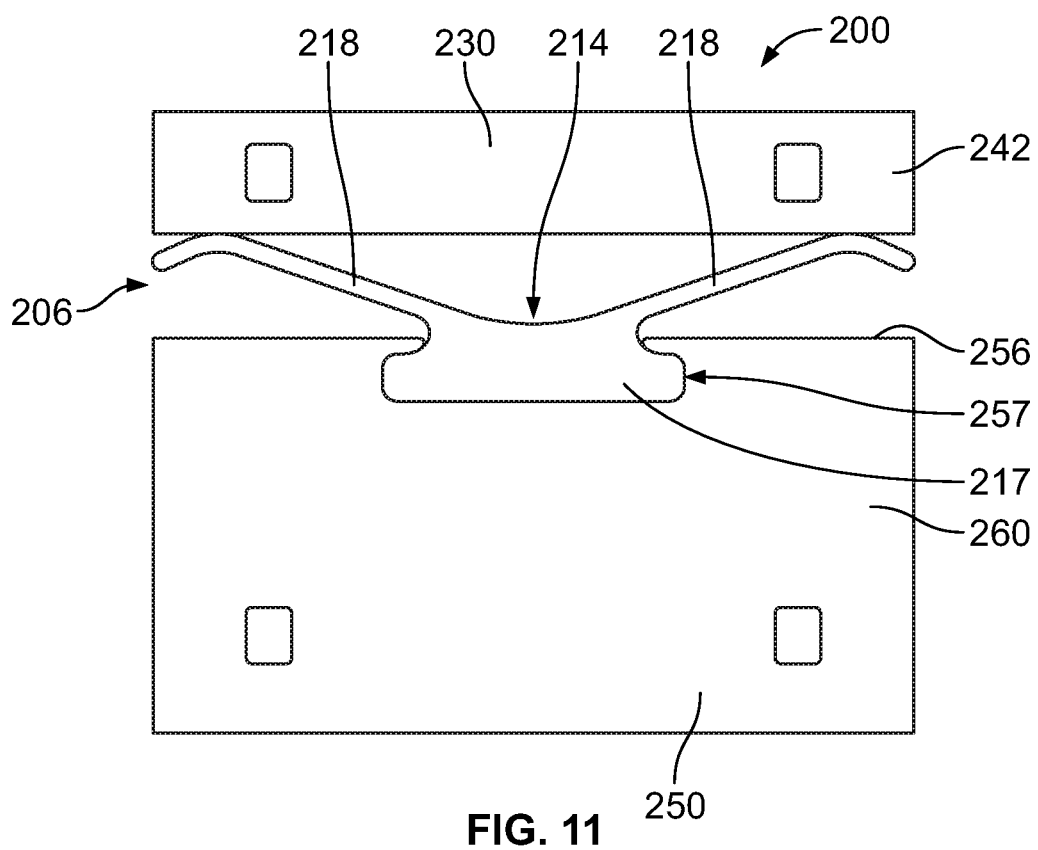
FIG. 11 is a cross-sectional view of the thermal bridge in accordance with an exemplary embodiment.

FIG. 10 is a cross-sectional view of the thermal bridge 200 in accordance with an exemplary embodiment taken through one of the upper bridge plates 240 and one of the lower spacer plates 262. FIG. 11 is a cross-sectional view of the thermal bridge 200 in accordance with an exemplary embodiment taken through one of the upper spacer plates 242 and one of the lower bridge plates 260.

The spring assembly 206 is located between the upper plates 230 and the lower plates 250. In the illustrated embodiment, the upper spring element 212 includes a base 215 and a pair of the spring arms 216 and the lower spring element 214 includes a base 217 and a pair of the spring arms 218. In the illustrated embodiment, the upper spring element 212 is separate and discrete from the upper plate 230 and the lower spring element 214 is separate and discrete from the lower plate 250, rather than being integral with the upper and lower plates 230, 250 (for example, FIGS. 8 and 9).

The spring arms 216 are integral with the base 215. The base 215 is discrete from the upper plate 230 and configured to be coupled to the upper plate 230, such as to a slot 237 at the inner end 236. For example, the base 215 may be welded to the upper plate 230 or attached by adhesive. The base 215 may be secured to the upper plate 230 by a dovetail or other securing feature of the base 215. In the illustrated embodiment, the base 215 is approximately centered along the inner end 236 having the spring arms 216 extending forward and rearward from the base 215. Other locations are possible in alternative embodiments. The upper spring element 212 may include a single spring arm 216 in alternative embodiments. In an exemplary embodiment, the upper plate 230 may be manufactured from a first material and the upper spring element 212 may be manufactured from a second material different from the first material. For example, the upper plate 230 may be manufactured from a highly thermally conductive material, such as sheet metal, aluminum, copper, steel, and the like. The upper spring element 212 may be manufactured from a material having good spring characteristics, such as metal, plastic, and the like.

The spring arms 218 are integral with the base 217. The base 217 is discrete from the lower plate 250 and configured to be coupled to the lower plate 250, such as to a slot 257 at the inner end 256. For example, the base 217 may be welded to the lower plate 250 or attached by adhesive. The base 217 may be secured to the lower plate 250 by a dovetail or other securing feature of the base 217. In the illustrated embodiment, the base 217 is approximately centered along the inner end 256 having the spring arms 218 extending forward and rearward from the base 217. Other locations are possible in alternative embodiments. The lower spring element 214 may include a single spring arm 218 in alternative embodiments. In an exemplary embodiment, the lower plate 250 may be manufactured from a first material and the lower spring element 214 may be manufactured from a second material different from the first material. For example, the lower plate 250 may be manufactured from a highly thermally conductive material, such as sheet metal, aluminum, copper, steel, and the like. The lower spring element 214 may be manufactured from a material having good spring characteristics such as metal, plastic, and the like.

It is to be understood that the above description is intended to be illustrative, and not restrictive. For example, the above-described embodiments (and/or aspects thereof) may be used in combination with each other. In addition, many modifications may be made to adapt a particular situation or material to the teachings of the invention without departing from its scope. Dimensions, types of materials, orientations of the various components, and the number and positions of the various components described herein are intended to define parameters of certain embodiments, and are by no means limiting and are merely exemplary embodiments. Many other embodiments and modifications within the spirit and scope of the claims will be apparent to those of skill in the art upon reviewing the above description. The scope of the invention should, therefore, be determined with reference to the appended claims, along with the full scope of equivalents to which such claims are entitled. In the appended claims, the terms "including" and "in which" are used as the plain-English equivalents of the respective terms "comprising" and "wherein." Moreover, in the following claims, the terms "first," "second," and "third," etc. are used merely as labels, and are not intended to impose numerical requirements on their objects. Further, the limitations of the following claims are not written in means-plus-function format and are not intended to be interpreted based on 35 U.S.C. § 112(f), unless and until such claim limitations expressly use the phrase "means for" followed by a statement of function void of further structure.

What is claimed is:

1. A thermal bridge comprising:
an upper bridge assembly including a plurality of upper plates arranged in an upper plate stack, each upper plate having a front end and a rear end, each upper plate having sides between the front end and the rear end, each upper plate having an inner end and an outer end, the plurality of upper plates including a plurality of first upper plates and a plurality of second upper plates, the first upper plates having a different shape than the second upper plates;
a lower bridge assembly including a plurality of lower plates arranged in a lower plate stack, each lower plate having a front end and a rear end, each lower plate having sides between the front end and the rear end, each lower plate having an inner end and an outer end, the outer ends of the lower plates configured to face and thermally couple to an electrical component, the sides of the lower plates facing the sides of the upper plates to thermally interface the lower plates with the upper plates, the plurality of lower plates including a plurality of first lower plates and a plurality of second lower plates, the first lower plates having a different shape than the second lower plates;
an upper spring element extending from the inner ends of each of the first upper plates, each upper spring element including an upper mating interface engaging a corresponding second lower plate of the plurality of second lower plates to bias the upper plates in a first biasing direction generally away from the lower bridge assembly;
a lower spring element extending from the inner ends of each of the first lower plates, each lower spring element including a lower mating interface engaging a corresponding second upper plate of the plurality of second upper plates to bias the lower plates in a second biasing direction generally away from the upper bridge assembly; and
a bridge frame having connecting elements extending through the upper plates and the lower plates, the connecting elements including couplers to hold the upper plates in the upper plate stack and to hold the lower plates in the lower plate stack.

2. The thermal bridge of claim 1, wherein the upper spring elements are coplanar with the corresponding upper plates and the lower spring elements are coplanar with the corresponding lower plates.

3. The thermal bridge of claim 1, wherein each upper plate has an upper plate width between the sides and each upper spring element has an upper spring width between the sides of the upper spring element, and wherein each lower plate has a lower plate width between the sides and each lower spring element has a lower spring width between the sides of the lower spring element.

4. The thermal bridge of claim 1, wherein the upper spring elements are angled transverse to the first biasing direction and wherein the lower spring elements are angled transverse to the second biasing direction.

5. The thermal bridge of claim 1, wherein each upper plate includes a single upper spring element and each lower plate includes a single lower spring element.

6. The thermal bridge of claim 1, wherein each upper plate includes a plurality of upper spring elements and each lower plate includes a plurality of lower spring elements.

7. The thermal bridge of claim 1, wherein the upper spring elements are integral with the upper plate being stamped and formed with the upper plate, and wherein the lower spring elements are integral with the lower plates being stamped and formed with the lower plates.

8. The thermal bridge of claim 1, wherein the upper spring elements are separate and discrete from the upper plates being coupled to the inner ends of the upper plates, the upper plates being manufactured from a first material and the upper spring elements be manufactured from a second material different from the first material, and wherein the lower spring elements are separate and discrete from the lower plates being coupled to the inner ends of the lower plates, the lower plates being manufactured from a first material and the lower spring elements being manufactured from a second material different from the first material.

9. The thermal bridge of claim 1, wherein the upper plates include upper slots receiving corresponding connecting elements and the lower plates include lower slots receiving corresponding connecting elements, the upper slots being oversized to allow the upper plates to move relative to the connecting elements, the lower slots being oversized to allow the lower plates to move relative to the connecting elements.

10. The thermal bridge of claim 1, wherein the connecting elements comprise pins extending entirely through the upper bridge assembly and the lower bridge assembly.

11. The thermal bridge of claim 1, wherein the upper plates comprise upper bridge plates having upper overlapping regions and the lower plates comprise lower bridge plates having lower overlapping regions, the upper overlapping regions overlapping with the lower overlapping regions to thermally coupled the upper plates and the lower plates.

12. The thermal bridge of claim 11, wherein the upper bridge assembly further comprises upper spacer plates between the upper bridge plates and the lower bridge assembly further comprises lower spacer plates between the lower bridge plates, the upper spacer plates being aligned with corresponding lower bridge plates and the lower spring elements of the lower bridge plates engage the corresponding upper spacer plates, the lower spacer plates being aligned with corresponding upper bridge plates and the upper spring elements of the upper bridge plates engage the corresponding lower spacer plates.

13. A thermal bridge comprising:
an upper bridge assembly including a plurality of upper plates arranged in an upper plate stack, each upper plate having a front end and a rear end, each upper plate having sides between the front end and the rear end, each upper plate having an inner end and an outer end, the upper plates including upper bridge plates and upper spacer plates, the upper bridge plates having upper overlapping regions;
a lower bridge assembly including a plurality of lower plates arranged in a lower plate stack, each lower plate having a front end and a rear end, each lower plate having sides between the front end and the rear end, each lower plate having an inner end and an outer end, the lower plates including lower bridge plates and lower spacer plates, the lower bridge plates having lower overlapping regions, the lower plates configured to face and thermally couple to an electrical component, the lower spacer plates being aligned with the upper bridge plates and the lower bridge plates being aligned with the upper spacer plates such that the lower overlapping regions overlap with the upper overlapping regions, the sides of the lower bridge plates thermally interfacing with the sides of the upper bridge plates;
upper spring elements extending from the inner ends of corresponding upper bridge plates, each upper spring element including an upper mating interface engaging the corresponding lower spacer plate to bias the upper plates in a first biasing direction generally away from the lower bridge assembly;
lower spring elements extending from the inner ends of corresponding lower bridge plates, each lower spring element including a lower mating interface engaging the corresponding upper spacer plate to bias the lower plates in a second biasing direction generally away from the upper bridge assembly; and
a bridge frame having connecting elements extending internally through the upper plates and the lower plates, the connecting elements including couplers to hold the upper plates in the upper plate stack and the lower plates in the lower plate stack.

14. The thermal bridge of claim 13, wherein the connecting elements comprise pins extending entirely through the upper bridge assembly and the lower bridge assembly.

15. The thermal bridge of claim 13, wherein the upper spring elements are coplanar with the corresponding upper plates and the lower spring elements are coplanar with the corresponding lower plates.

16. The thermal bridge of claim 13, wherein each upper plate has an upper plate width between the sides and each upper spring element has an upper spring width between the sides of the upper spring element, and wherein each lower plate has a lower plate width between the sides and each lower spring element has a lower spring width between the sides of the lower spring element.

17. The thermal bridge of claim 13, wherein each upper plate includes at least one upper spring element contained within an envelope defined by the front end, the rear end and the sides of the upper plate and wherein each lower plate includes at least one lower spring element contained within an envelope defined by the front end, the rear end and the sides of the lower plate.

18. The thermal bridge of claim 13, wherein the upper plates include upper slots receiving corresponding connecting elements and the lower plates include lower slots receiving corresponding connecting elements, the upper slots being oversized to allow the upper plates to move relative to the connecting elements, the lower slots being oversized to allow the lower plates to move relative to the connecting elements.

19. A communication system comprising:
an electrical component having a component thermal interface;
a heat transfer device including a thermal coupler having a device thermal interface; and
a thermal bridge thermally coupled between the component thermal interface and the device thermal interface, the thermal bridge comprising:
an upper bridge assembly including a plurality of upper plates arranged in an upper plate stack, each upper plate having a front end and a rear end, each upper plate having sides between the front end and the rear end, each upper plate having an inner end and an outer end, the upper plates including upper bridge plates and upper spacer plates, the upper bridge plates having upper overlapping regions;
a lower bridge assembly including a plurality of lower plates arranged in a lower plate stack, each lower plate having a front end and a rear end, each lower plate having sides between the front end and the rear end, each lower plate having an inner end and an outer end, the lower plates including lower bridge plates and lower spacer plates, the lower bridge plates having lower overlapping regions, the lower plates configured to face and thermally couple to an electrical component, the lower spacer plates being aligned with the upper bridge plates and the lower bridge plates being aligned with the upper spacer plates such that the lower overlapping regions overlap with the upper overlapping regions, the sides of the lower bridge plates thermally interfacing with the sides of the upper bridge plates;
upper spring elements extending from the inner ends of corresponding upper bridge plates, each upper spring element including an upper mating interface engaging the corresponding lower spacer plate to bias the upper plates in a first biasing direction generally away from the lower bridge assembly;
lower spring elements extending from the inner ends of corresponding lower bridge plates, each lower spring element including a lower mating interface engaging the corresponding upper spacer plate to bias the lower plates in a second biasing direction generally away from the upper bridge assembly; and a bridge frame having connecting elements extending internally through the upper plates and the lower plates, the connecting elements including couplers to hold the upper plates in the upper plate stack and the lower plates in the lower plate stack.

20. The communication system of claim 19, wherein each upper plate includes at least one upper spring element contained within an envelope defined by the front end, the rear end and the sides of the upper plate and wherein each lower plate includes at least one lower spring element contained within an envelope defined by the front end, the rear end and the sides of the lower plate.

* * * * *